(12) United States Patent
Nakata et al.

(10) Patent No.: US 8,574,962 B2
(45) Date of Patent: Nov. 5, 2013

(54) METHOD OF MANUFACTURING SEMICONDUCTOR DEVICE

(75) Inventors: Kazunari Nakata, Tokyo (JP); Yoshiaki Terasaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/231,198

(22) Filed: Sep. 13, 2011

(65) Prior Publication Data

US 2012/0214278 A1 Aug. 23, 2012

(30) Foreign Application Priority Data

Feb. 23, 2011 (JP) ................................. 2011-036654

(51) Int. Cl.
  *H01L 21/00* (2006.01)
(52) U.S. Cl.
  USPC .................................. 438/113; 257/E21.499
(58) Field of Classification Search
  USPC ................... 438/113; 257/E21.499, E21.214, 257/E21.24
  See application file for complete search history.

(56) References Cited

U.S. PATENT DOCUMENTS

| 2002/0019084 A1 | 2/2002 | Francis et al. |
| 2008/0200037 A1 | 8/2008 | Tsai et al. |
| 2010/0022071 A1* | 1/2010 | Arita et al. ................... 438/463 |
| 2010/0264566 A1 | 10/2010 | Moore et al. |
| 2011/0039389 A1* | 2/2011 | Yamashita et al. ............ 438/303 |
| 2011/0059612 A1 | 3/2011 | Nakata et al. |

FOREIGN PATENT DOCUMENTS

| JP | 5-114593 | | 5/1993 |
| JP | 2005-317570 | | 11/2005 |
| JP | 2006-196710 | * | 7/2006 |
| JP | 2008-226940 A | | 9/2008 |
| JP | 2011-29483 A | | 2/2011 |

OTHER PUBLICATIONS

U.S. Appl. No. 12/981,796, filed Dec. 30, 2010, Nakata.
German Office Action dated Dec. 20, 2012, for German Patent Application No. 10 2011 084 525.9.
Korean Office Action Issued Jun. 5, 2013 in Patent Application No. 10-2012-0010588 (with English translation).

* cited by examiner

*Primary Examiner* — Tony Tran
(74) *Attorney, Agent, or Firm* — Oblon, Spivak, McClelland, Maier & Neustadt, L.L.P.

(57) ABSTRACT

A method of manufacturing a semiconductor device comprises the steps of (a) applying a resin member onto a front surface of a semiconductor wafer having an uneven structure on the front surface thereof, and (b) flattening a surface of the resin member by heating the resin member, and in the method, the resin member is formed also on a side surface of the semiconductor wafer. The method further comprises the steps of (c) performing a thinning process for the semiconductor wafer on a back surface thereof after the step (b), and (d) removing the resin member from the semiconductor wafer after the step (c). By the method, it is possible to uniformize the thickness of a semiconductor wafer which is thinned and reduce the number of foreign matters remaining on a surface of the semiconductor wafer.

4 Claims, 10 Drawing Sheets

|  | WAFER No. | THE NUMBER OF FOREIGN MATTERS AFTER REMOVAL OF RESIN MEMBER (IN 1 $\mu$m OR MORE) |
|---|---|---|
| WITH RESIN MEMBER | #01 | 2 |
|  | #02 | 7 |
|  | #03 | 3 |
| WITHOUT RESIN MEMBER | #01 | 135 |
|  | #02 | 214 |
|  | #03 | 358 |

|  | WAFER No. | THE NUMBER OF FLAWS AND FOREIGN MATTERS AFTER REMOVAL OF RESIN MEMBER (IN 5 μm OR MORE) |
|---|---|---|
| WITH RESIN MEMBER | #01 | 1 |
|  | #02 | 0 |
|  | #03 | 2 |
| WITHOUT RESIN MEMBER | #01 | 280 |
|  | #02 | 384 |
|  | #03 | 192 |

|  | WAFER No. | THE NUMBER OF FOREIGN MATTERS AFTER DICING (IN 10 μm OR MORE) |
|---|---|---|
| WITH RESIN MEMBER | #01 | 15 |
|  | #02 | 7 |
|  | #03 | 28 |
| WITHOUT RESIN MEMBER | #01 | 538 |
|  | #02 | 472 |
|  | #03 | 853 |

METHOD OF MANUFACTURING SEMICONDUCTOR DEVICE

BACKGROUND OF THE INVENTION

1. Field of the Invention

The present invention relates to a method of manufacturing a semiconductor device, and more particularly to a technique for thinning a semiconductor wafer.

2. Description of the Background Art

In the field of memory, microprocessor, or the like, dense packaging using three dimensional packaging or the like has been developed in semiconductor devices. With the development of dense packaging, it is required to reduce the thickness of a semiconductor wafer, and today, the thickness of a semiconductor wafer at the time of completion of a process for manufacturing a semiconductor device is reduced to about 25 µm.

Further, in inverter circuits such as industrial motors, automobile motors, and the like, power supply devices for mass-storage servers, uninterruptible power supplies, and the like, power semiconductor devices for handling relatively large power mainly ranging from several hundreds kilowatts to several megawatts are sometimes used. Such power semiconductor devices each include a semiconductor switch such as MOSFET (Metal-Oxide-Semiconductor Field-Effect Transistor), IGBT (Insulated Gate Bipolar Transistor), or the like. As IGBTs, conventionally, planar gate type ones have been widely used, but recently, vertical IGBTs using trench gates are used for high integration.

In such power semiconductor devices, a thinning process for thinning semiconductor wafers is performed in order to improve energization performance such as On-state characteristics. In recent years, devices are manufactured through an ultra-thin wafer process thinning wafers which are manufactured by wafer materials obtained by the FZ (Floating Zone) method, up to about 60 µm, for improvement in terms of cost and characteristics.

In the process for thinning semiconductor wafers, generally, mechanical grinding (polishing) such as backgrinding or polishing and chemical grinding (polishing) such as wet etching, dry etching, or the like for removing processing distortion caused by the mechanical grinding are performed, and then various processings are performed. In order to prevent the breakage of the semiconductor wafer due to the uneven structure formed thereon or the like in the grinding process, conventionally, a surface protection tape is attached as a reinforcing member and a step absorbing member onto a surface of the semiconductor wafer on which the uneven structure is formed.

In a case of thin devices used in recent year, however, since the proportion of the unevenness to the total thickness of the device increases, the absorption of the unevenness by the surface protection tape is insufficient and the semiconductor wafer is sometimes broken in the grinding process.

In order to solve the above problem, Japanese Patent Application Laid Open Gazette No. 2005-317570 (Patent Document 1) proposes a method in which the semiconductor wafer is heated after the surface protection tape is attached onto a surface thereof, whereby the surface protection tape is deformed to ease the level differences formed on the surface of the semiconductor wafer, and this prevents the breakage of the semiconductor wafer in the process for manufacturing a semiconductor element. Further, Japanese Patent Application Laid Open Gazette No. 2006-196710 (Patent Document 2) proposes a method in which a surface protection tape comprising an adhesive layer having a thickness larger than the height of the unevenness is used, to thereby ease high level differences formed on the surface of the surface protection tape.

The methods in which the surface protection tape is attached onto the surface of the semiconductor wafer, however, can produce an insufficient effect of suppressing the effect of the unevenness, and consequently, there remain some cases where the wafer is broken. There arises another problem that a large number of foreign matters remain on the surface of the semiconductor wafer after a series of process steps executed on the semiconductor wafer are completed.

SUMMARY OF THE INVENTION

It is an object of the present invention to provide a technique for uniformizing the thickness of a semiconductor wafer which is thinned and reducing the number of foreign matters remaining on a surface of the semiconductor wafer.

The present invention is intended for a method of manufacturing a semiconductor device. According to the present invention, the method of manufacturing a semiconductor device includes the steps (a) to (d). The step (a) is to apply a resin member onto a first main surface of a semiconductor wafer having an uneven structure on the first main surface thereof. The step (b) is to flatten a surface of the resin member by heating the resin member. By the step (a) or the step (b), the resin member is formed also on a side surface of the semiconductor wafer. The step (c) is to perform a thinning process for the semiconductor wafer on a second main surface thereof after the step (b). The step (d) is to remove the resin member from the semiconductor wafer after the step (c).

By the method of the present invention, it is possible to uniformize the thickness of the semiconductor wafer which is thinned. This prevents the semiconductor wafer from being broken. It is also possible to reduce the number of foreign matters remaining on a surface of the semiconductor wafer.

These and other objects, features, aspects and advantages of the present invention will become more apparent from the following detailed description of the present invention when taken in conjunction with the accompanying drawings.

DESCRIPTION OF THE PREFERRED EMBODIMENTS

<The First Preferred Embodiment>

Figure 1:
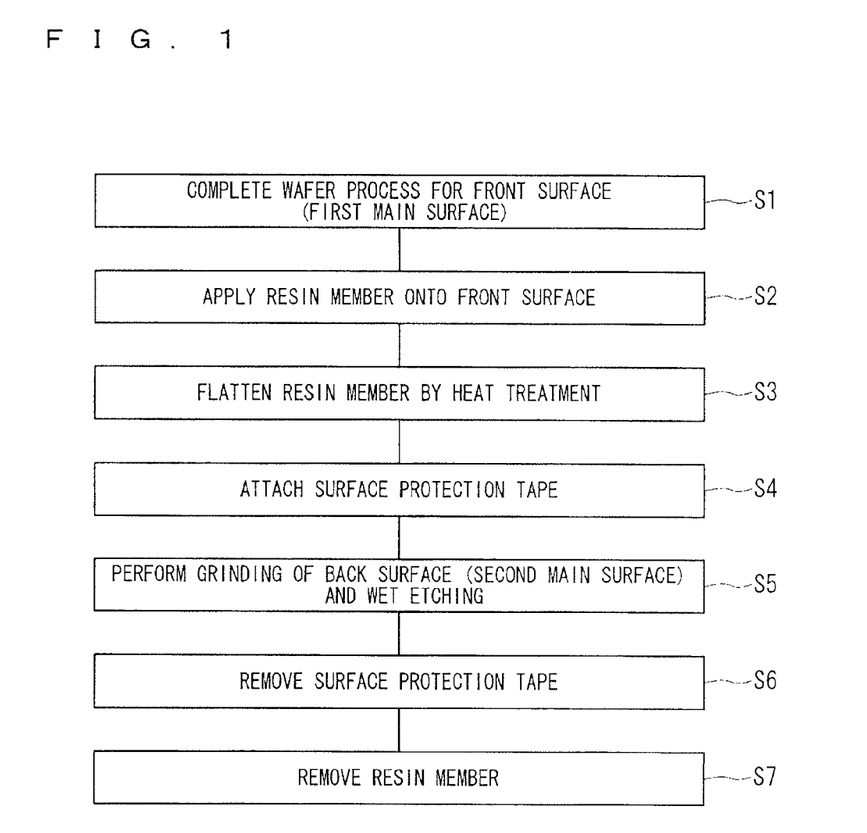
FIG. 1 is a flowchart showing a method of manufacturing a semiconductor device in accordance with a first preferred embodiment.

FIG. 1 is a flowchart showing a method of manufacturing a semiconductor device in accordance with the first preferred embodiment of the present invention. Discussion will be made now on an outline of the manufacturing method. A resin member is formed on a first main surface (hereinafter, referred to as a "front surface") of a semiconductor wafer on which an uneven structure such as a transistor structure or the like is formed, and then the resin member is heated. After that, thinning of a second main surface (hereinafter, referred to as a "back surface") of the semiconductor wafer is performed and then the resin member is removed.

Figure 2:
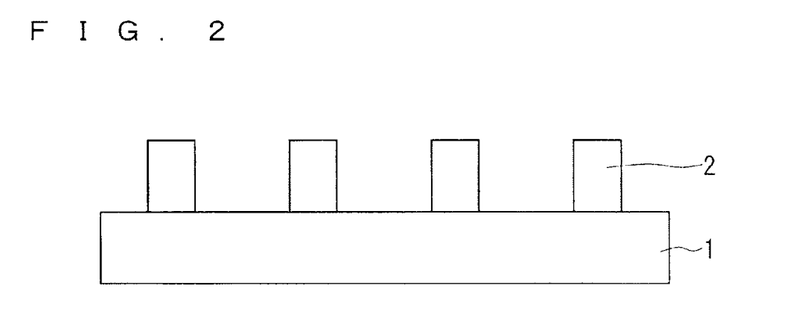
FIG. 2 is a cross section showing the state of a semiconductor wafer in Step S1.
Figure 3:
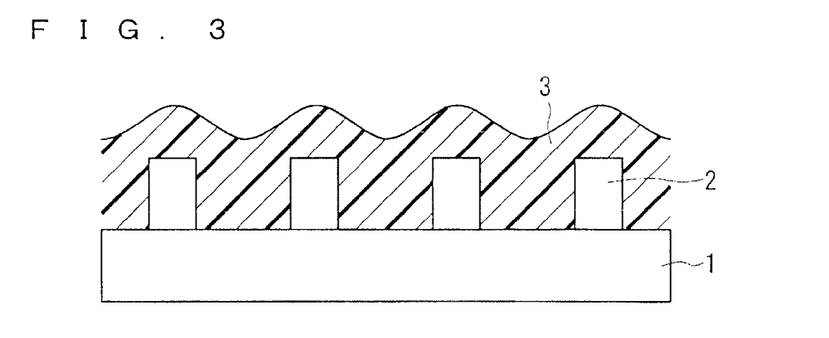
FIG. 3 is a cross section showing the state of the semiconductor wafer in Step S2.
Figure 4:
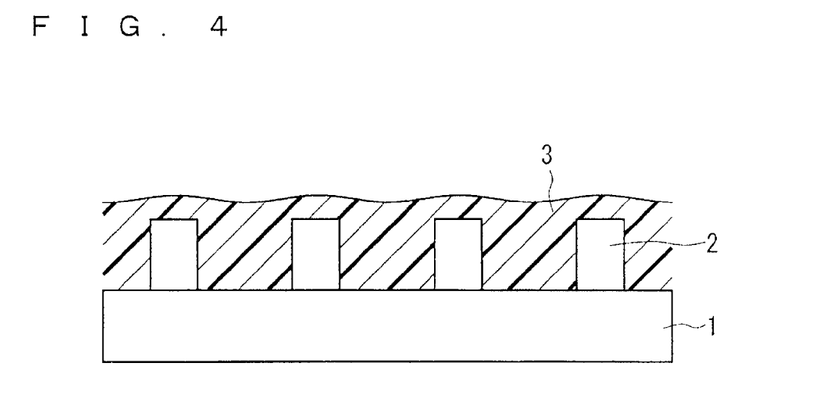
FIG. 4 is a cross section showing the state of the semiconductor wafer in Step S3.

FIGS. 2 to 4 are cross sections showing the respective states of the semiconductor wafer in Steps S1 to S3 of FIG. 1. Next, with reference to the flowchart of FIG. 1, the cross sections of FIGS. 2 to 4, and the like, discussion will be made below on the method of manufacturing a semiconductor device in accordance with the first preferred embodiment.

First, in Step S1, an uneven structure 2 such as a transistor structure, electrodes, and the like is formed on a front surface of a semiconductor wafer 1, as shown in FIG. 2, to thereby complete a wafer process for the front surface.

In Step S2, a resin member 3 (a thermoplastic resin such as a polyimide resin or the like) is applied directly onto the front surface of the semiconductor wafer 1 on which the uneven structure 2 is formed, as shown in FIG. 3. The resin member 3 is applied sufficiently thick so that the thickness of the resin member 3 may be larger than the level difference of the uneven structure 2.

In Step S3, the resin member 3 is heated from the back surface of the semiconductor wafer 1 by using a heating means such as a hot plate or the like. The heat treatment is performed on the resin member 3, for example, at a temperature of 200° C. for three minutes. A surface of the resin member 3 is thereby flattened as shown in FIG. 4.

Figure 5:
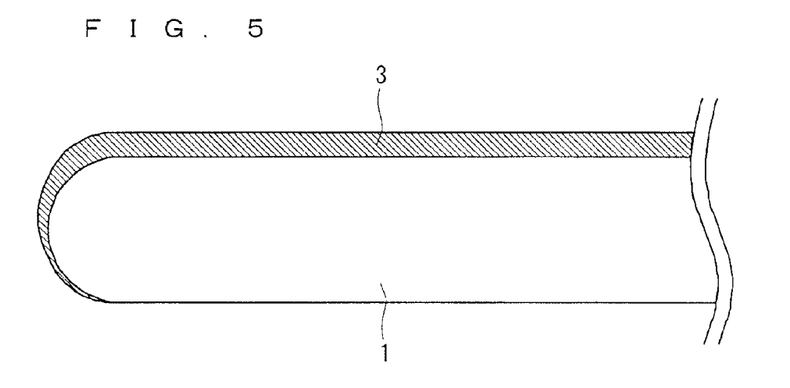
FIG. 5 is a schematic cross section showing the state of the semiconductor wafer in Step S3.

FIG. 5 is a schematic cross section showing an end portion of the semiconductor wafer 1 at the point of time when the heating of the resin member 3 is completed. In the first preferred embodiment, as shown in FIG. 5, the resin member 3 is formed also on a side surface of the semiconductor wafer 1 at the point of time when the heating is completed. The resin member 3 may be formed on the side surface of the semiconductor wafer 1 when the resin member 3 is applied in Step S2 or when the resin member 3 is heated in Step S3. It is thereby possible to protect the end portion of the semiconductor wafer 1 and prevent any crack from the end portion and any chip in the end portion.

Figure 6:
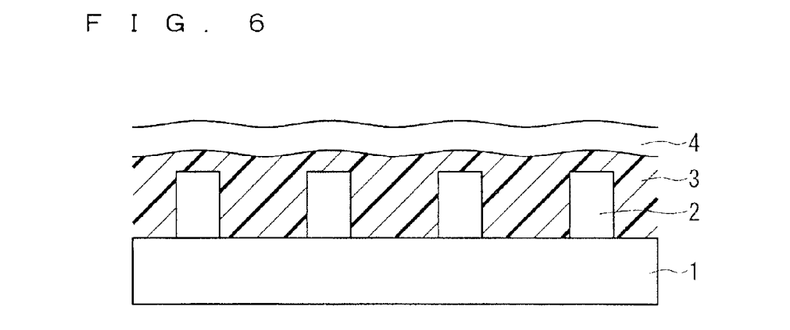
FIG. 6 is a cross section showing the state of the semiconductor wafer in Step S4.

In Step S4, a surface protection tape 4 consisting of a sheet base formed of, for example, polyethylene terephthalate (PET) and an acrylic paste material is attached onto the flattened surface of the resin member 3, as shown in FIG. 6. By attaching this surface protection tape 4, it is possible to protect the resin member 3 in a thinning process discussed later and reduce any damage on the resin member 3 in the processing. If such an effect is not needed, however, it is not necessary to execute Step S4.

In Step S5, a thinning process for the semiconductor wafer 1 on the back surface thereof is performed. In the first preferred embodiment, as the thinning process, the back surface of the semiconductor wafer 1 is mechanically ground. As necessary, a fractured layer caused by the mechanical grinding may be chemically ground by wet etching using a mixed acid containing hydrofluoric acid and acetic acid.

Figure 7:
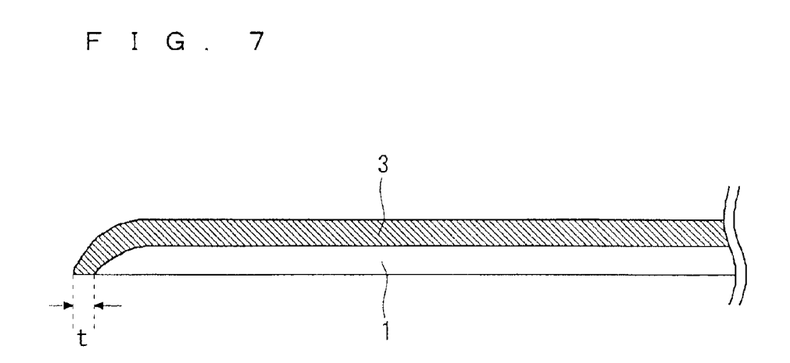
FIG. 7 is a schematic cross section showing the state of the semiconductor wafer in Step S5.
Figure 8:
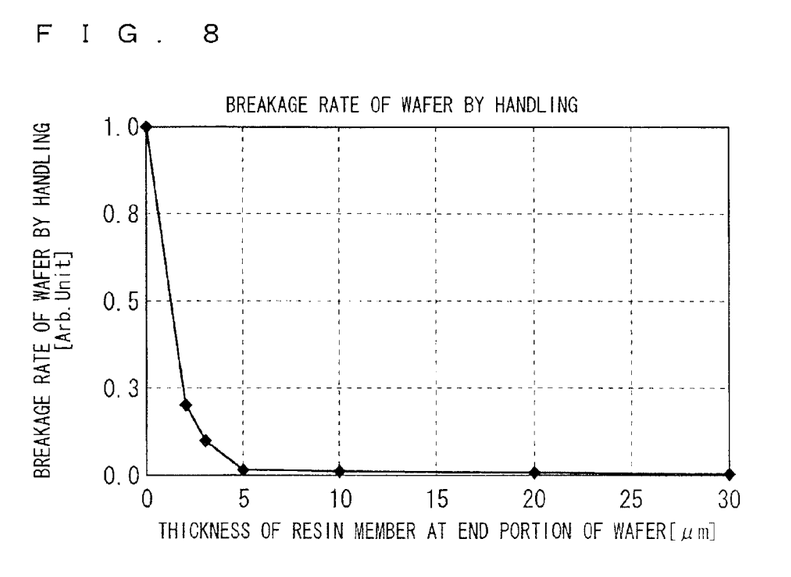
FIG. 8 is a graph showing a relation between the thickness of a resin member on a side surface of the semiconductor wafer and the breakage rate.

FIG. 7 is a schematic cross section showing the state of the end portion of the semiconductor wafer 1 after Step S5, i.e., after the thinning process. FIG. 8 is a graph showing a relation between the thickness t of the resin member 3 on the side surface of the semiconductor wafer 1 shown in FIG. 7 and the rate of the breakage of the semiconductor wafer 1 caused by the wafer handling in a process apparatus.

In the first preferred embodiment, the thickness t of the resin member 3 formed on the side surface of the semiconductor wafer 1 after executing the thinning process is 5 μm or more. It is thereby possible to sufficiently protect the end portion of the semiconductor wafer 1, and this remarkably reduces the breakage rate of the semiconductor wafer 1, as shown in FIG. 8.

In a case where Step S4 for attaching the surface protection tape 4 is executed, after Step S5, the surface protection tape 4 is removed from the resin member 3 in Step S6 and then Step S7 discussed next is executed. In a case where Step S4 for attaching the surface protection tape 4 is not executed, after Step S5, Step S7 is subsequently executed.

In Step S7, the resin member 3 is removed from the semiconductor wafer 1. For removal, the resin member 3 may be solved by an organic solvent which is dropped from above the semiconductor wafer 1 or may be subjected to an ashing process in which the resin member 3 is carbonized by using plasma containing oxygen.

Further, in the first preferred embodiment, the resin member 3 may be removed by using a mixed solution containing sulfuric acid and oxygenated water. In this case, the resin member 3 can be reliably removed from the semiconductor wafer 1. Furthermore, the resin member 3 may be removed by using both the mixed solution and the plasma containing oxygen. Also in this case, the resin member 3 can be reliably removed from the semiconductor wafer 1.

Though there are various methods for removing the resin member 3 as discussed above, herein the resin member 3 is removed by using the organic solvent.

Next, a sample is actually manufactured by the manufacturing method in accordance with the first preferred embodiment, and the effect is checked. Specifically, in Step S1, the uneven structure 2 having a level difference of 10 μm is formed on the front surface of the semiconductor wafer 1 which is formed of silicon. Then, in Step S2, the resin member 3 is applied to have a thickness of 20 µm, and in Step S3, a heat treatment is performed on the resin member 3 at a temperature of 200° C. for three minutes. In Step S4, the surface protection tape 4 having a thickness of 120 µm is attached thereto. In Step S5, the semiconductor wafer 1 is ground to 85 µm by using an in-feed grinder device and then etched to 65 µm by using a mixed acid consisting of hydrofluoric acid, nitric acid, sulfuric acid, and phosphoric acid.

Figure 9:
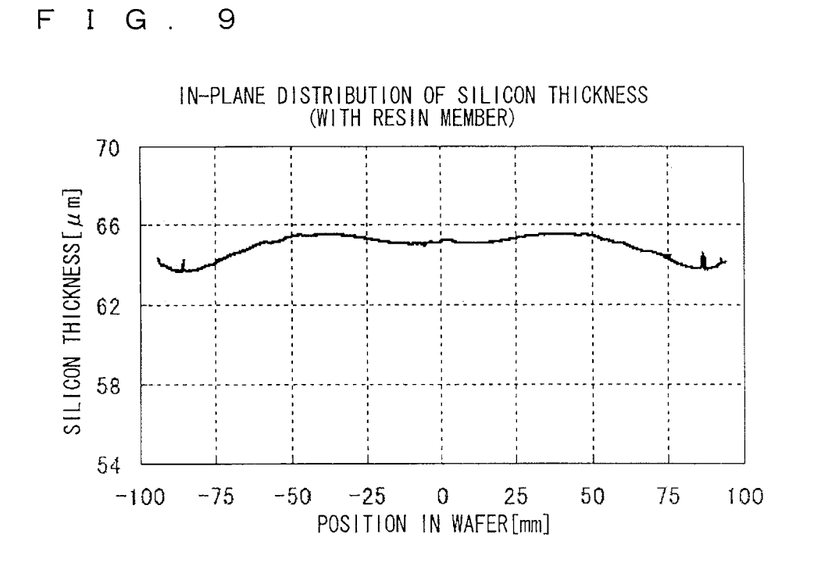
FIG. 9 is a graph showing a result of the measurement of the thickness of the semiconductor wafer after being subjected to a method of manufacturing a semiconductor device in accordance with the first preferred embodiment.
Figure 10:
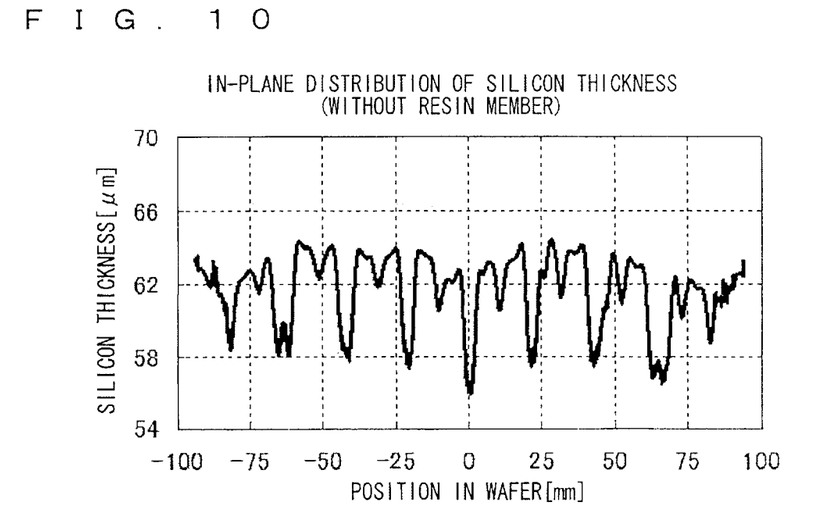
FIG. 10 is a graph showing a result of the measurement of the thickness of the semiconductor wafer after being subjected to a manufacturing method as comparison.

FIG. 9 is a graph showing a result of the measurement of the thickness of the semiconductor wafer 1 after being subjected to the method of manufacturing a semiconductor device in accordance with the first preferred embodiment. Specifically, after the thinning of the semiconductor wafer 1 is performed under the above conditions, the silicon thickness of the semiconductor wafer 1 is measured with changing measurement position along the direction of the diameter of the wafer by using a noncontact thickness measurement device (Optical MicroGauge manufactured by Hamamatsu Photonics K.K.) using infrared beams of light, and the result of the measurement is shown in FIG. 9. FIG. 10 is a graph showing a result of the similar measurement of the silicon thickness of the semiconductor wafer 1, which is performed after a process step for thinning the semiconductor wafer 1 on which no resin member 3 is applied and only the surface protection tape 4 having a thickness of 120 µm is attached (this method is hereinafter referred to as a "manufacturing method as comparison" in the first preferred embodiment).

As can be seen from FIG. 10, in the manufacturing method as comparison, the thickness of the thinned semiconductor wafer 1 varies. As a result, the semiconductor wafer 1 locally becomes too thin, and the wafer is thereby liable to break.

Herein, as an improvable method of uniformizing the thickness in the manufacturing method as comparison, it can be thought that the surface protection tape 4 is formed of a relatively flexible material and the level difference in the uneven structure 2 is eased by the surface protection tape 4. In this case, however, the stiffness of the surface protection tape 4 is insufficient to respond to the deflection of the wafer caused when the semiconductor wafer 1 is thinned, and this makes the conveyance of the wafer, or the like, difficult in the process apparatus.

Further, as another improvable method, it can be thought that the paste of the surface protection tape 4 is formed of a material which is relatively easy to flow and the level difference in the uneven structure 2 is eased by the paste material. In this case, however, if the wet etching using the above-discussed mixed acid is performed in the thinning process, the paste material exposed at an end portion of the surface protection tape 4 reacts with the mixed acid, and after the removal of the surface protection tape 4, the paste material which reacts with the mixed acid becomes a foreign matter. Further, since the paste material at the end portion of the surface protection tape 4 disappears, the crack and chip in the semiconductor wafer 1 become liable to occur. Furthermore, if such various processes as discussed later in the after-mentioned preferred embodiments are performed after the thinning process, there is a strong possibility that flaws and foreign matters will appear on the surface of the semiconductor wafer 1 and cracks will occur in the chip in the following assembly process.

On the other hand, in the method of manufacturing a semiconductor device in accordance with the first preferred embodiment, the resin member 3 can sufficiently ease the level difference in the uneven structure 2 and the resin member 3 has sufficient stiffness in the thinning process. As a result, it is possible to uniformize the thickness of the thinned semiconductor wafer 1, as shown in FIG. 9. This can prevent the wafer from being broken.

Figure 11:
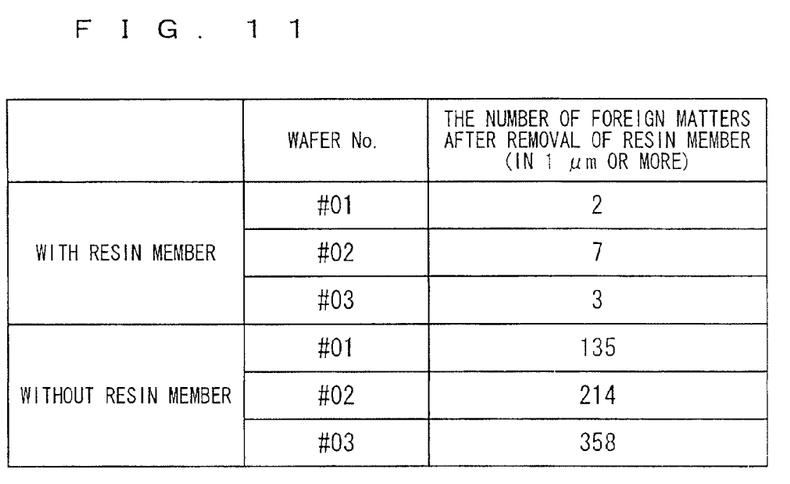
FIG. 11 is a view showing an effect of the method of manufacturing a semiconductor device in accordance with the first preferred embodiment.

FIG. 11 is a view showing the number of foreign matters remaining on the front surface of the semiconductor wafer 1 after being subjected to the method of manufacturing a semiconductor device in accordance with the first preferred embodiment or the manufacturing method as comparison. As can be seen from FIG. 11, it is possible to reduce the number of foreign matters remaining on the front surface of the semiconductor wafer 1 in the method of manufacturing a semiconductor device in accordance with the first preferred embodiment, as compared with that in the manufacturing method as comparison.

Consideration will be made on the reason therefore. It can be thought, as the main cause for the foreign matters, that the paste material of the surface protection tape 4 reacts with the mixed acid used for the above-discussed wet etching to become residues (foreign matters) as discussed above. On the other hand, in the first preferred embodiment, the surface protection tape 4 has been removed when the resin member 3 is removed and no residue is left. Even if some foreign matters remain on the resin member 3, the foreign matters are lifted off from the surface of the semiconductor wafer 1 when the resin member 3 is removed. As a result, in the method of manufacturing a semiconductor device in accordance with the first preferred embodiment, it is possible to reduce the number of foreign matters remaining on the front surface of the semiconductor wafer 1.

Thus, in the method of manufacturing a semiconductor device in accordance with the first preferred embodiment, it is possible to uniformize the thickness of the thinned semiconductor wafer 1. This prevents the semiconductor wafer 1 from being broken. Further, it is possible to reduce the number of foreign matters remaining on the front surface of the semiconductor wafer 1.

<The Second Preferred Embodiment>

Figure 12:
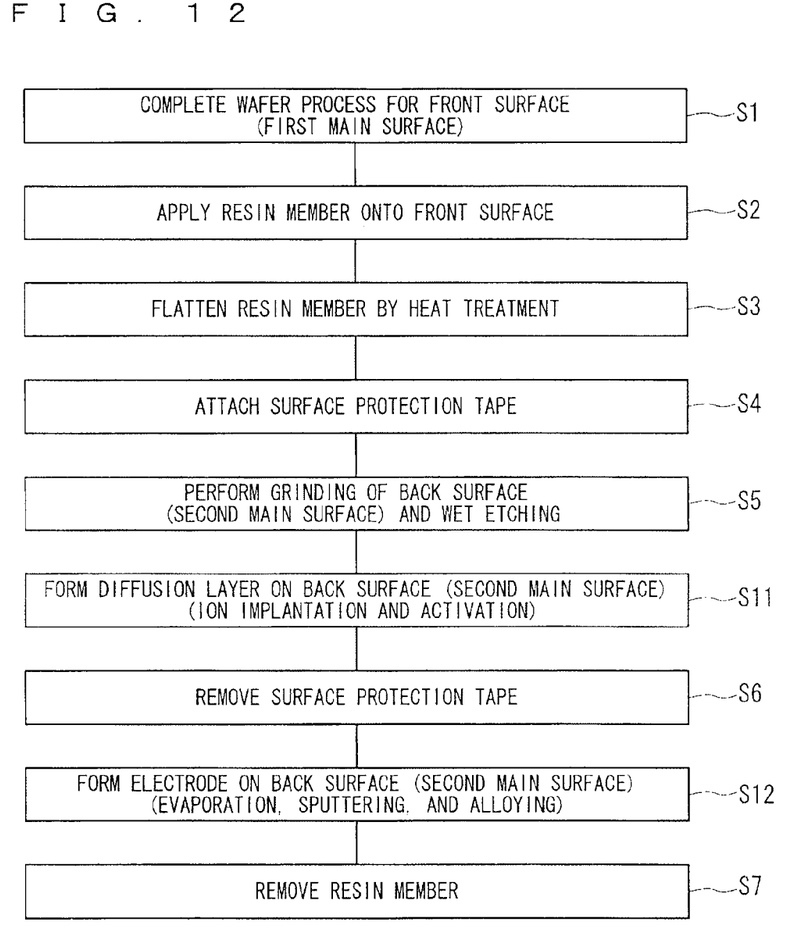
FIG. 12 is a flowchart showing a method of manufacturing a semiconductor device in accordance with a second preferred embodiment.

FIG. 12 is a flowchart showing a method of manufacturing a semiconductor device in accordance with the second preferred embodiment of the present invention. In the method of manufacturing a semiconductor device in accordance with the second preferred embodiment, the similar (same) steps and constituent elements as those in the manufacturing method of the first preferred embodiment are represented by the same reference signs, and discussion will be made below centering on the steps and constituent elements which are greatly different from those in the first preferred embodiment.

As shown in FIG. 12, in the method of manufacturing a semiconductor device in accordance with the second preferred embodiment, Steps S11 and S12 are added between the process step for thinning (Step S5) and the process step for removing the resin member 3 (Step S7) in the manufacturing flow (FIG. 1) of the first preferred embodiment. More specifically, Step S11 is executed between the process step for thinning (Step S5) and the process step for removing the surface protection tape 4 (Step S6), and Step S12 is executed between the process step for removing the surface protection tape 4 (Step S6) and the process step for removing the resin member 3 (Step S7).

Also in the second preferred embodiment, Steps S4 and S6 for attaching and removing the surface protection tape 4 are not always necessary, and if Steps S4 and S6 are not executed, after Step S5, Steps S11, S12, and S7 are sequentially executed.

Next, detailed discussion will be made on Steps S11 and S12.

Figure 13:
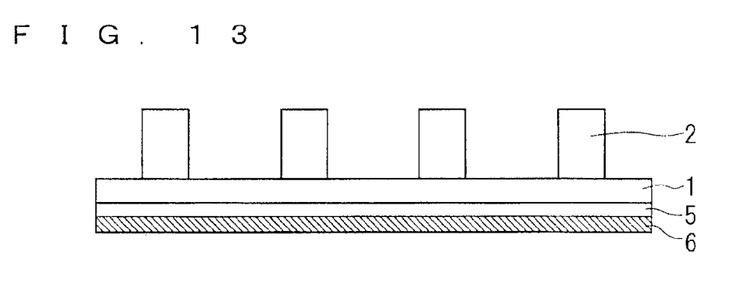
FIG. 13 is a cross section showing the method of manufacturing a semiconductor device in accordance with the second preferred embodiment.

In Step S11, a diffusion layer 5 is formed on the back surface of the semiconductor wafer 1, as shown in FIG. 13. In the second preferred embodiment, in Step S11, the back surface of the semiconductor wafer 1 is implanted with ions and then subjected to a treatment for activating the ions by using an electric furnace or a laser, whereby the diffusion layer 5 is formed thereon.

In Step S12, an electrode 6 is formed on the back surface of the semiconductor wafer 1, as shown in FIG. 13. In the second preferred embodiment, in Step S12, a metal film formed of aluminum, titanium, nickel, gold, or the like is formed on the back surface of the semiconductor wafer 1 by film formation such as evaporation, sputtering, or the like, and then the metal film is patterned, to thereby form the electrode 6. After that, in order to ensure the electrical connection between the semiconductor wafer 1 (for example, silicon wafer) on which the diffusion layer 5 is formed and the metal film (for example, aluminum), a heat treatment is performed, for example, at a temperature of 300 to 450° C., to thereby diffuse silicon and aluminum in both the regions. The reason why the process step for removing the surface protection tape 4 (Step S6) is executed before Step S12 is that the surface protection tape 4 which generally has no resistance to the heat treatment is prevented from being melted during the above-discussed high temperature heat treatment.

After Step S12, like in the first preferred embodiment, the resin member 3 is removed from the semiconductor wafer 1 in Step S7. For removal, the resin member 3 may be solved by an organic solvent which is dropped from above the semiconductor wafer 1 or may be subjected to the above-discussed ashing process. Further, in the second preferred embodiment, the resin member 3 may be removed by using a mixed solution containing sulfuric acid and oxygenated water. The resin member 3 may be removed by both using the mixed solution and performing the ashing process.

Figure 14:
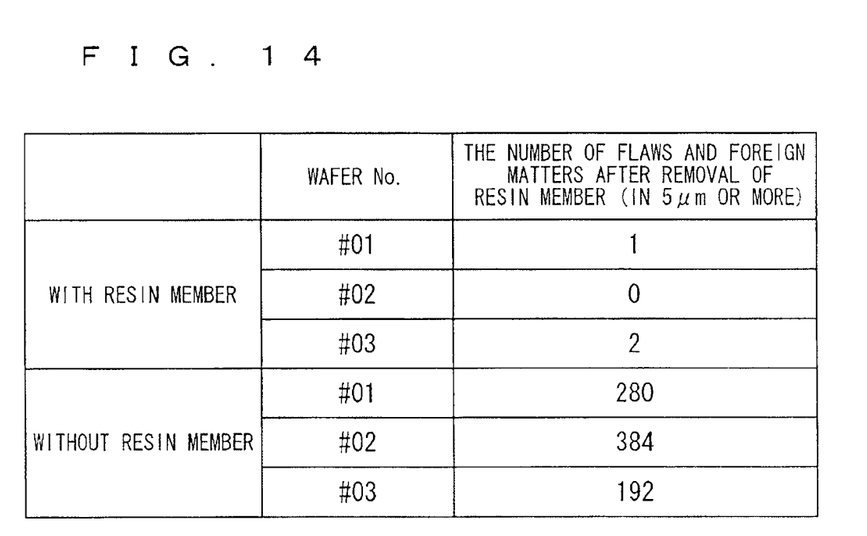
FIG. 14 is a view showing an effect of the method of manufacturing a semiconductor device in accordance with the second preferred embodiment.

FIG. 14 is a view showing the number of flaws and foreign matters on the front surface of the semiconductor wafer 1 after being subjected to the method of manufacturing a semiconductor device in accordance with the second preferred embodiment or a manufacturing method in which the electrode 6 is formed on the back surface of the wafer without forming the resin member 3 (this method is hereinafter referred to as a "manufacturing method as comparison" in the second preferred embodiment). As can be seen from FIG. 14, it is possible to reduce the number of flaws and foreign matters on the front surface of the semiconductor wafer 1 in the method of manufacturing a semiconductor device in accordance with the second preferred embodiment, as compared with that in the manufacturing method as comparison.

Consideration will be made on the reason therefore. It can be thought, as the main cause for the flaws and foreign matters, that the front surface side of the semiconductor wafer 1 adsorbs onto a stage during the formation of the electrode 6 after the surface protection tape 4 is removed. On the other hand, in the second preferred embodiment, the front surface of the semiconductor wafer 1 is protected by the resin member 3 and does not come into a direct contact with the stage. As a result, in the method of manufacturing a semiconductor device in accordance with the second preferred embodiment, it is possible to reduce the number of flaws and foreign matters remaining on the front surface of the semiconductor wafer 1.

Further, as an improvable method for preventing the above in the manufacturing method as comparison, it can be thought that the ion implantation for forming the diffusion layer 5 and the film formation for forming the electrode 6 are performed with the surface protection tape 4 attached. In this case, however, since a heat load is imposed in a vacuum in these processes, the ion implantation fails because of degassing from the paste material of the surface protection tape 4 and the film quality of the electrode 6 disadvantageously varies in the film formation. Therefore, in the manufacturing method as comparison, it is difficult to produce the same effect as that in the manufacturing method of the second preferred embodiment.

<The Third Preferred Embodiment>

Figure 15:
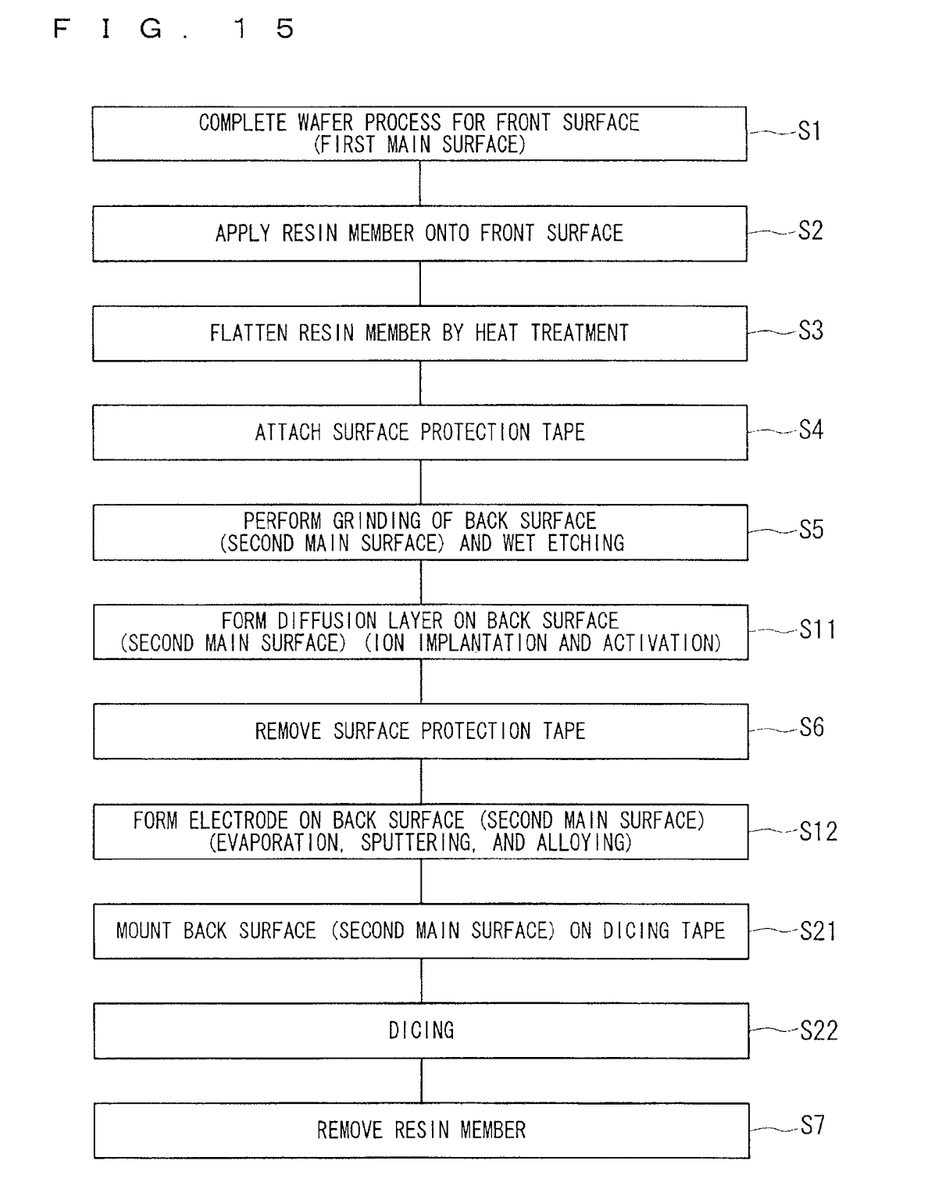
FIG. 15 is a flowchart showing a method of manufacturing a semiconductor device in accordance with a third preferred embodiment.

FIG. 15 is a flowchart showing a method of manufacturing a semiconductor device in accordance with the third preferred embodiment of the present invention. In the method of manufacturing a semiconductor device in accordance with the third preferred embodiment, the similar (same) steps and constituent elements as those in the manufacturing method of the second preferred embodiment are represented by the same reference signs, and discussion will be made below centering on the steps and constituent elements which are greatly different from those in the first preferred embodiment.

As shown in FIG. 15, in the method of manufacturing a semiconductor device in accordance with the third preferred embodiment, Steps S21 and S22 are added between the process step for forming the electrode (Step S12) and the process step for removing the resin member 3 (Step S7) in the manufacturing flow (FIG. 12) of the second preferred embodiment. Also in the third preferred embodiment, Steps S4 and S6 for attaching and removing the surface protection tape 4 are not always necessary.

Next, detailed discussion will be made on Steps S21 and S22.

Figure 16:
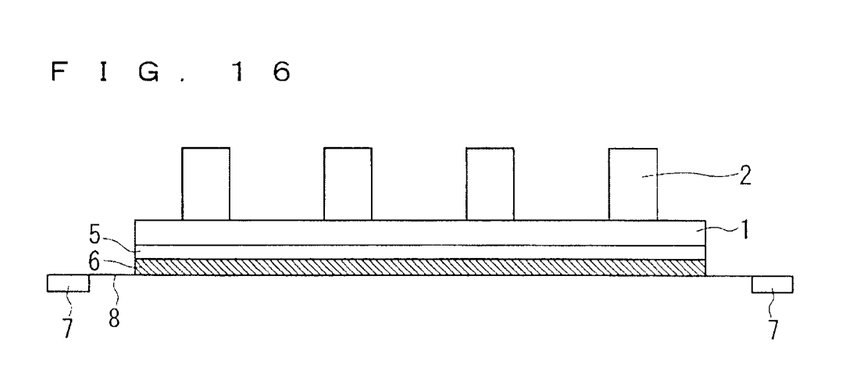
FIG. 16 is a cross section showing the method of manufacturing a semiconductor device in accordance with the third preferred embodiment.

In Step S21, the back surface of the semiconductor wafer 1 is mounted on a dicing tape 8 which is so provided as to block a hole of a dicing frame 7, as shown in FIG. 16. The dicing tape 8 has a surface which is provided with a paste material, and the semiconductor wafer 1 is fixed onto the dicing tape 8 with the paste material.

In Step S22, the semiconductor wafer 1 mounted on the dicing tape 8 is cut into individual chips by using a dicing device having, for example, a blade, a laser, or the like.

After Step S22, the resin member 3 is removed from the semiconductor wafer 1 in Step S7. For removal, the resin member 3 may be solved by an organic solvent which is dropped from above the semiconductor wafer 1 (above the dicing frame 7) or may be subjected to the above-discussed ashing process.

Figure 17:
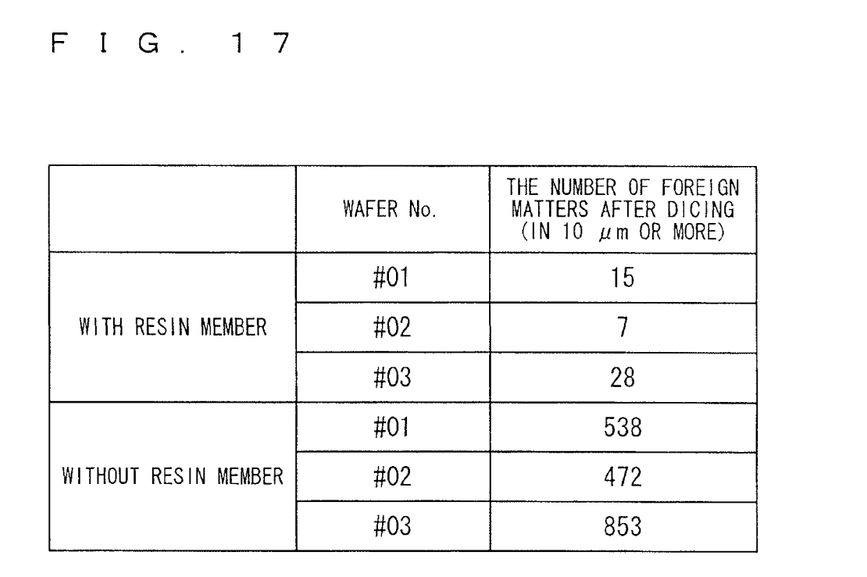
FIG. 17 is a view showing an effect of the method of manufacturing a semiconductor device in accordance with the third preferred embodiment.

FIG. 17 is a view showing the number of foreign matters (cutting chips in the dicing, or the like) remaining on the front surface of the semiconductor wafer 1 which is thinned to have a thickness of 65 μm and cut into individual chips after being subjected to the manufacturing method of the third preferred embodiment or a manufacturing method in which the dicing is performed without forming the resin member 3 (this method is hereinafter referred to as a "manufacturing method as comparison" in the third preferred embodiment). As can be seen from FIG. 17, it is possible to reduce the number of foreign matters remaining on the front surface of the semiconductor wafer 1 in the method of manufacturing a semiconductor device in accordance with the third preferred embodiment, as compared with that in the manufacturing method as comparison.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device, comprising the steps of:

(a) applying a resin member directly onto a first main surface of a semiconductor wafer having an uneven structure on said first main surface thereof;
(b) flattening a surface of said resin member by heating said resin member;
(c) performing a thinning process for said semiconductor wafer on a second main surface thereof after said step (b);
(d) removing said resin member from said semiconductor wafer after said step (c);
(e) between said step (b) and said step (c), attaching a surface protection tape directly onto said surface of said resin member which is flattened;
(f) removing said surface protection tape from said resin member between said step (c) and said step (d);
further comprising the steps of:
(g) forming a diffusion layer on said second main surface of said semiconductor wafer between said step (c) and said step (d);
(h) forming an electrode on said second main surface of said semiconductor wafer between said step (g) and said step (d); and further comprising the steps of:
(i) mounting said second main surface of said semiconductor wafer onto a dicing tape between said step (h) and said step (d); and
(i) performing dicing on said semiconductor wafer to dice said semiconductor wafer into individual chips between said step (i) and said step (d).

2. The method of manufacturing a semiconductor device according to claim 1, wherein the thickness of said resin member which is formed on said end portion of said semiconductor wafer is 5 µm or more after said step (c).

3. The method of manufacturing a semiconductor device according to claim 1, wherein said resin member is removed by using a mixed solution containing sulfuric acid and oxygenated water in said step (d).

4. The method of manufacturing a semiconductor device according to claim 3, wherein said resin member is removed also by performing plasma treatment using oxygen in said step (d).

* * * * *